United States Patent
Hou et al.

(10) Patent No.: US 8,253,487 B2
(45) Date of Patent: Aug. 28, 2012

(54) TRACKING POWER SUPPLY, METHOD FOR CONTROLLING POWER SUPPLY, AND COMMUNICATION APPARATUS

(75) Inventors: Zhaozheng Hou, Shenzhen (CN); Xujun Liu, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 5 days.

(21) Appl. No.: 12/982,093

(22) Filed: Dec. 30, 2010

(65) Prior Publication Data

US 2011/0193629 A1  Aug. 11, 2011

(30) Foreign Application Priority Data

Feb. 10, 2010  (CN) .......................... 2010 1 0113619

(51) Int. Cl.
*H03G 3/20* (2006.01)

(52) U.S. Cl. .......................... 330/127; 330/297; 330/136

(58) Field of Classification Search ................. 330/136, 330/127, 297, 279, 199
See application file for complete search history.

(56) References Cited

U.S. PATENT DOCUMENTS 7,482,869 B2 *  1/2009  Wilson .......................... 330/199
* cited by examiner

*Primary Examiner* — Hieu Nguyen
(74) *Attorney, Agent, or Firm* — Brinks, Hofer, Gilson & Lione

(57) ABSTRACT

A tracking power supply, a method for controlling a power supply, and a communication apparatus are disclosed. The tracking power supply includes: a basic voltage output unit, configured to provide a basic voltage; and a compensation voltage output unit, configured to provide a compensation voltage. The compensation voltage output unit and the basic voltage output unit are connected in series so as to provide a voltage which is the sum of the basic voltage and the compensation voltage for a load.

20 Claims, 7 Drawing Sheets

TRACKING POWER SUPPLY, METHOD FOR CONTROLLING POWER SUPPLY, AND COMMUNICATION APPARATUS

CROSS-REFERENCE TO RELATED APPLICATION

This application claims priority to Chinese application No. 201010113619.5 filed on Feb. 10, 2010, which is hereby incorporated by reference in its entirety.

FIELD OF THE DISCLOSURE

The present disclosure relates to the field of communication technology, and in particular, to a tracking power supply, a method for controlling a power supply, and a communication apparatus.

BACKGROUND OF THE DISCLOSURE

In order to take full advantage of a spectrum, a modern wireless communication system, such as a Code Division Multiple Address (CDMA), a Wideband Code Division Multiple Address (WCDMA), a Universal Mobile Telecommunication System (UMTS), and a Long Term Evolution (LTE), uses a variable envelope modulation technology which performs amplitude modulation and phase modulation simultaneously. The technology has a high Peak-to-Average Power Ratio (PAPR) and a wide dynamic range. However, a too high PAPR causes a transmitter to have high linearity requirements for a power amplifier and often operate under the level of an envelope peak.

The variable envelope modulation technology needs to use a linear power amplifier to amplify a signal. In order to ensure the linearity and increase the power amplification efficiency, an Envelope Tracking (ET)-based technology is often used. As shown in FIG. 1, a radio frequency signal is input and then transmitted to a radio frequency power amplifier after amplification by a driving amplifier. At the same time, an envelope signal of the radio frequency signal is extracted by an envelope detector, the envelope signal is amplified through a tracking power supply, and the amplified envelope signal is used as a drain voltage of the radio frequency power amplifier. Finally, the amplified radio frequency signal is output through the radio frequency power amplifier.

With the development of the multi-carrier modulation technology, when the tracking power supply performs linear amplification on the extracted envelope signal, the requirements for the bandwidth and efficiency of the tracking power supply are higher. For example, in the process of performing envelope amplification, the bandwidth of an envelope signal may reach tens of MHz, while the bandwidth of a common switching power supply can hardly meet the requirements for the envelope tracking bandwidth due to the limitations of semiconductor technology and switching frequency, and the output noise and distortion may be modulated to a carrier, thus causing out-of-band spectrum spread and severely affecting the Adjacent Channel Power Ratio (ACPR) of the signal. Therefore, a novel fast tracking power supply with high efficiency and high bandwidth is required to meet the growing application needs.

SUMMARY OF THE DISCLOSURE

An embodiment of the present disclosure provides a tracking power supply, a method for controlling a power supply, and a communication apparatus, for outputting a high-bandwidth and high-efficiency tracking power supply.

An embodiment of the present disclosure provides a tracking power supply, where the tracking power supply includes: a level providing unit, configured to provide one or more level outputs; a level shift unit, configured to select the level outputs in the level providing unit according to a received first control signal, and output the selected level output as a basic voltage; a linear amplifier, configured to out put a compensation voltage according to a second control signal, in which the compensation voltage is configured to compensate the basic voltage; a current detection unit, configured to detect an output current of the linear amplifier, and output a third control signal; and a switch tracking current source, configured to receive the third control signal, adjust an output current, implement low-frequency tracking of a load current, and reduce an effective value of the output current of the linear amplifier, in which the linear amplifier and the switch tracking current source are connected in parallel and then connected in series with the level shift unit.

An embodiment of the present disclosure further provides a method for controlling a tracking power supply, where the method includes: receiving a first control signal, and controlling a level shift unit to select a voltage from a plurality of voltages and output the voltage as a basic voltage; receiving a second control signal, controlling a linear amplifier to output a compensation voltage, and outputting the basic voltage and the compensation voltage after series connection and superposition to a load; and detecting an output current of the linear amplifier, outputting a third control signal, controlling a switch tracking current source to implement low-frequency tracking of a load current according to the third control signal, and adjusting a difference between the output load current of the linear amplifier and an output current of the switch tracking current source.

An embodiment of the present disclosure further provides a communication apparatus, where the communication apparatus includes: a radio frequency amplification unit, configured to perform radio frequency amplification on a received radio frequency signal; and a transmission processing unit, configured to perform a transmission process on the radio frequency signal amplified by the radio frequency amplification unit, in which the radio frequency amplification unit includes: an envelope detector, configured to detect an envelope of the received radio frequency signal and obtain an envelope signal; a tracking power supply, configured to receive the envelope signal and amplify the envelope signal; a driving amplifier, configured to perform signal amplification on the received radio frequency signal; and a radio frequency power amplifier, configured to receive the envelope signal amplified by the fast tracking power supply and the amplified signal output by the driving amplifier, and amplify the radio frequency signal, in which the tracking power supply includes: a level providing unit, configured to provide one or more level outputs; a level shift unit, configured to select the level outputs in the level providing unit according to a received first control signal, and output the selected level output as a basic voltage; a linear amplifier, configured to output a compensation voltage according to a second control signal, in which the compensation voltage is configured to compensate the basic voltage; a current detection unit, configured to detect an output current of the linear amplifier, and output a third control signal; and a switch tracking current source, configured to receive the third control signal, adjust an output current, provide a low-frequency high current in a load current, and reduce an effective value of the output current of the linear amplifier, in which the linear amplifier and the switch tracking current source are connected in parallel and then connected in series with the level shift unit.

DETAILED DESCRIPTION OF THE DRAWINGS

To make the technical solutions of the present disclosure clearer, the accompanying drawings for illustrating the embodiments of the present disclosure or the prior art are outlined below. Apparently, the accompanying drawings are for the exemplary purpose only, and persons of ordinary skill in the art can derive other drawings from such accompanying drawings without any creative effort.

DETAILED DESCRIPTION OF THE EMBODIMENTS

The technical solutions of the present disclosure are elaborated below with reference to accompanying drawings. Evidently, the embodiments described below are for the exemplary purpose only, without covering all embodiments of the present disclosure. Persons of ordinary skill in the art can derive other embodiments from the embodiments given herein without making any creative effort, and all such embodiments are covered in the protection scope of the present disclosure.

Embodiment 1

Figure 1:
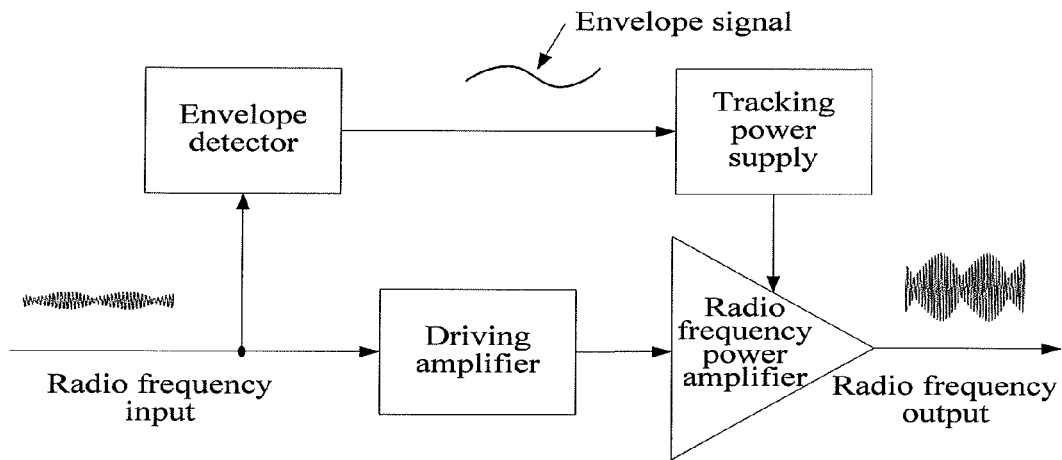
FIG. 1 is a schematic view of amplification of a radio frequency signal using the ET-based technology in the prior art.
Figure 2A:
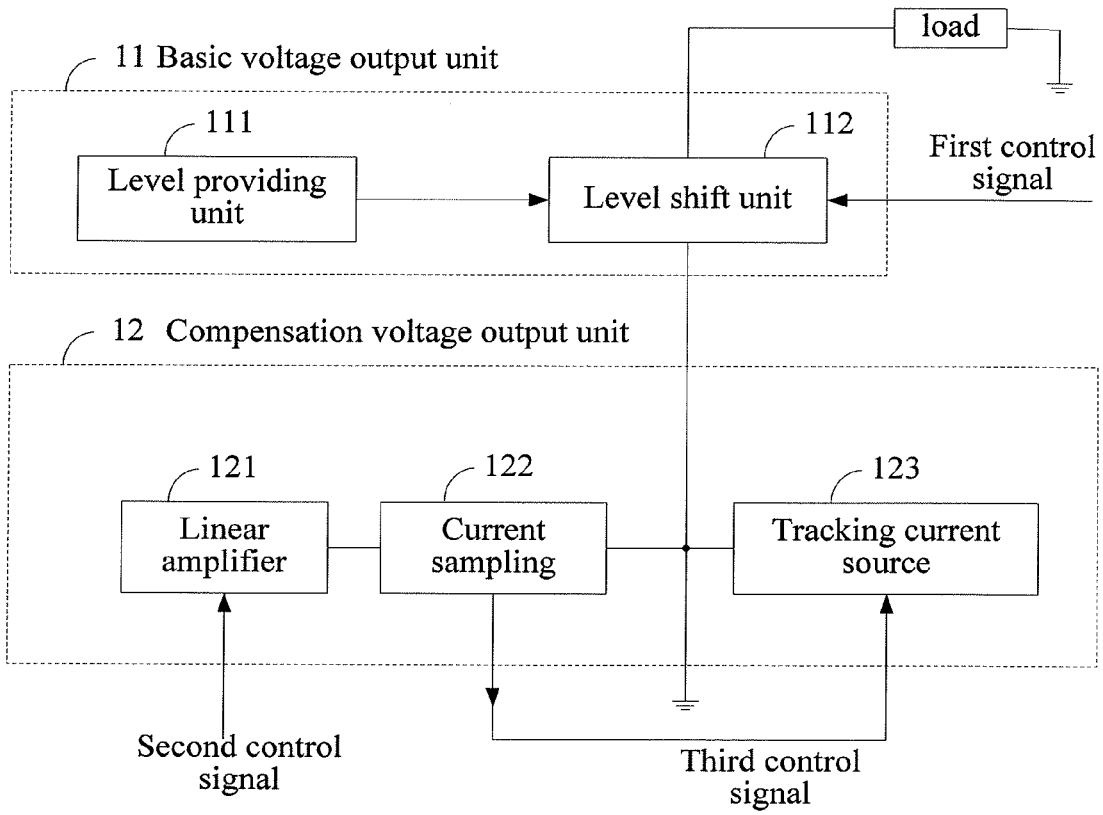
FIG. 2A is a schematic structural view of a tracking power supply according to Embodiment 1 of the present disclosure.

A tracking power supply is provided according to Embodiment 1 of the present disclosure. Referring to FIG. 2A, the tracking power supply includes:

a basic voltage output unit 11, which includes a level providing unit 111, configured to provide one or more level outputs; and a level shift unit 112, configured to select the level outputs in the level providing unit according to a received first control signal, and output the selected level output as a basic voltage; and a compensation voltage output unit 12, which includes a linear amplifier 121, a current sampling unit 122, and a switch tracking current source 123.

The linear amplifier and the current tracking output unit are connected in parallel and then connected in series with the basic voltage output unit so as to provide a voltage which is the sum of the basic voltage and a compensation voltage for a load.

The current detection unit 122 is configured to detect an output current of the linear amplifier 121, output a third control signal to control an output current of the switch tracking current source 123, and reduce the output current of the linear amplifier 121, so that the output current of the switch tracking current source 123 tracks a load current.

The linear amplifier 121 is configured to output a compensation voltage according to the third control signal, in which the compensation voltage is configured to compensate the basic voltage.

Figure 2B:
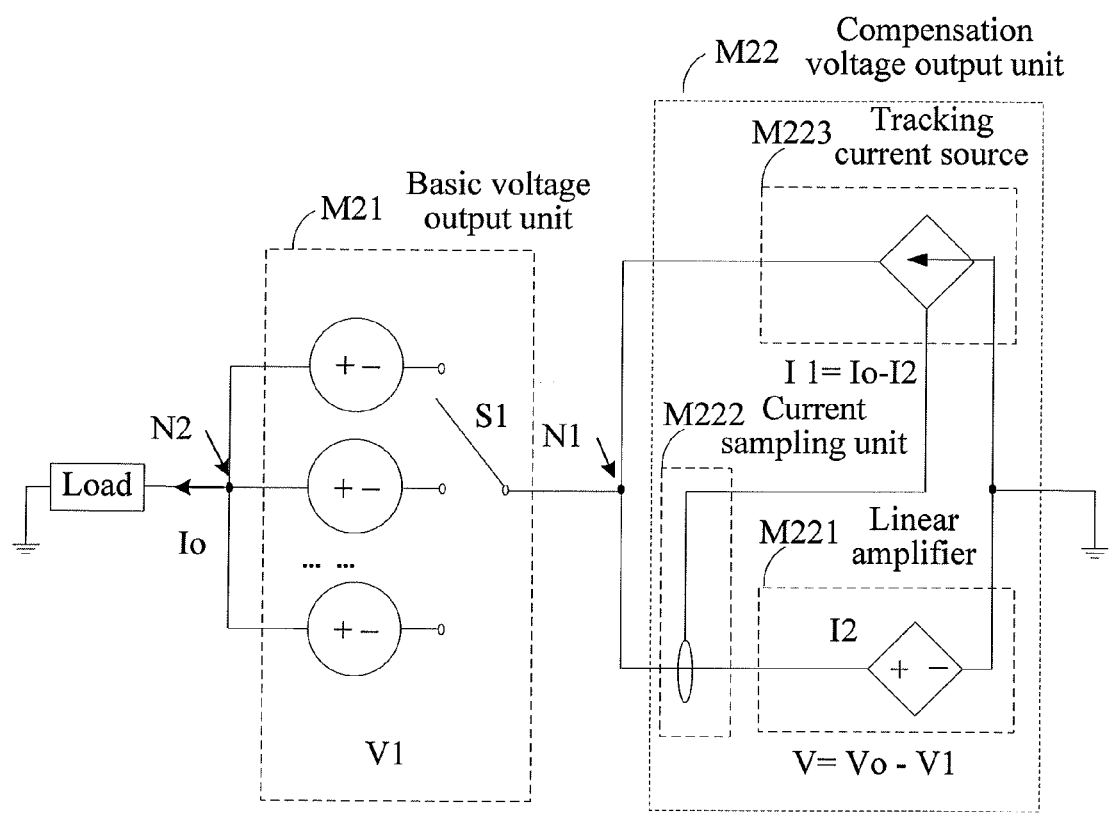
FIG. 2B is a schematic equivalent circuit diagram of the tracking power supply according to Embodiment 1 of the present disclosure.

Referring to FIG. 2B, the tracking power supply according to the embodiment of the present disclosure may be equivalent to the following circuit which includes a first voltage supply M21, a second voltage supply M221, a first current detection unit M222, and a current supply M223. The first voltage supply M21 is equivalent to the basic voltage output unit 11 and is configured to output a basic voltage; the circuit formed by the second voltage supply M221, the first current detection unit M222, and the current supply M223 is equivalent to the compensation voltage output unit 12. The second voltage supply M221 is equivalent to the linear amplifier 121 and is configured to output a compensation voltage to compensate the basic voltage; the first current detection unit M222 is equivalent to the current detection unit 122; and the current supply M223 is equivalent to the switch tracking current source 123 and is configured to track a load current. The second voltage supply M221 is also configured to correct and compensate the output current of the switch tracking current source.

The tracking power supply according to this embodiment of the present disclosure is configured to output an amplified tracking signal. Compared with the voltage of the tracking signal output by the tracking power supply, the aforementioned basic voltage has lower precision. Therefore, a compensation voltage is required to compensate and correct the basic voltage, and the compensation voltage is implemented through an amplifier unit (equivalent to the second voltage supply in FIG. 3) in the embodiment of the present disclosure. In addition, the linear amplifier compensates the basic voltage by being connected in parallel with the switch tracking current source and then connected in series with the basic voltage output unit, in which the switch tracking current source is configured to provide a low-frequency part in a load current and the linear amplifier outputs a compensation current to compensate the output current of the switch tracking current source. The basic voltage and the basic current herein refer to main parts of the final output voltage and current. The compensation voltage and the compensation current are respectively configured to compensate and correct the basic voltage and the basic current, so that the final output signal may be consistent with the ideal output signal as much as possible.

Moreover, the tracking power supply according to one embodiment of the present disclosure may further include a control unit configured to receive a reference signal, and output a first control signal and a second control signal according to the received reference signal.

In a radio frequency signal amplification system, the reference signal of the control unit comes from an envelope detector and generally has low voltage and power, which needs to be amplified through the tracking power supply. The reference signal may be an analog signal or a digital signal.

Moreover, the control unit further needs to perform delay matching when outputting the control signals to the units after receiving the reference signal, so that the units output signals consistently in time, thus obtaining a correct output signal after superposition.

In another embodiment, the first control signal and the second control signal may be respectively provided by different controllers; in another embodiment, the second control signal received by the linear amplifier may also be obtained directly from the reference signal after delay matching instead of being output by the control unit. When the reference signal is a digital signal, because the linear amplifier needs analog input, digital-to-analog (D/A) conversion is required to convert the reference signal into an analog signal.

In the implementation, the control unit may be implemented by a processing chip such as a Digital Signal Processor (DSP) or a Field Programmable Gate Array (FPGA), or other processing units with a similar function.

The level providing unit in the basic voltage output unit according to the embodiment of the present disclosure is configured to provide one or more level outputs. For example, levels may be output by using an isolation power supply which has a topology such as fly-back, forward, half-bridge, push-pull, and full-bridge, and uses a circuit type such as magnetic coupling of one primary winding of transformer for multi-outputs or magnetic coupling of a plurality of primary windings of transformers for a single output or multi-outputs.

The level shift unit in the basic voltage output unit includes multiple level selection branches constituted by elements such as switching components, driving components, and diodes. In an embodiment, the level providing unit divides a voltage signal to be tracked into several ranges as a group of levels A1-An. A level corresponding to a reference signal is within a level range, the level shift unit selects an adjacent level. The number of levels may be selected according to factors such as required tracking precision, tolerable cost, and area. The switching component is configured to select on the different levels provided by the level providing unit. The switching component may implement by a high-speed Metal-Oxide-Semiconductor Field-Effect Transistor (MOSFET) or a triode. The driving component is configured to provide a drive (for example, provide a suitable switching voltage) for the switch component, and may use a bootstrap driving component or an isolation driving component according to the actual application. The diode is configured to prevent forward current of different voltage level sources and provide reverse prohibition. The implementation of specific circuit of the selection branches is not limited, and different circuits may select for implementation according to the different components (such as a triode or a MOSFET).

Through the selection of the level shift unit, the final output voltage has a stepwise waveform and a low bandwidth.

The compensation voltage output unit in the embodiment of the present disclosure includes a linear amplifier, a current detection unit, and a switch tracking current source. The switch tracking current source includes a switch mode current supply circuit constituted by elements such as a switching component, a diode, a driving component, and an inductance. Because the switch tracking current source has a low tracking bandwidth (due to the limitation of the switching frequency), the output current of the switch tracking current source is controlled according to detecting result of the output current of the linear amplifier by the current detection unit, thus implementing low-frequency tracking of the output load current.

The current detection unit detects the output current of the linear amplifier. When the changing speed of the load current is within the tracking bandwidth of the switch tracking current source, the switch tracking current source may preliminarily track the change of the load current, and the linear amplifier needs to provide a small part of high-precision correction current. When the load current increases rapidly (exceeds the tracking bandwidth of the switch tracking current source), the linear amplifier with a high tracking speed responds first, the output current of the linear amplifier increases, the current detection unit outputs a third control signal which causes the output current of the switch tracking current source to increase and gradually approach the load current, and the output current of the linear amplifier decreases accordingly. Similarly, when the load current decreases rapidly (exceeds the tracking bandwidth of the switch tracking current source), the output current of the linear amplifier decreases first, and a high negative current may be output, the current detection unit outputs a third control signal which causes the output current of the switch tracking current source to decrease and gradually approach the load current, and the effective value of the output current of the linear amplifier decreases accordingly.

In one embodiment of the present disclosure, the linear amplifier may be an amplifier with a Push-Pull structure, for example, a Class A, Class B, or Class AB linear amplifier according to the actual requirements. The linear power devices may use a MOSFET, a triode, or a high-frequency power tube with good frequency characteristics. In order to improve the tracking precision, the linear amplifier may also employ output feedback control.

In one embodiment of the present disclosure, the reference levels of the units may be selected according to the actual application. For example, the reference level of the compensation voltage output unit may be a ground level, and the reference level of the basic voltage output unit may be the output level of the compensation voltage output unit; or, the reference level of the basic voltage output unit may be a ground level, and the reference level of the compensation voltage output unit may be the output level of the basic voltage output unit.

In one embodiment of the present disclosure, the linear amplifier may output a high-precision and high-bandwidth signal, but the efficiency is low; by contrast, the basic voltage output unit has high output efficiency, but the output signal has low bandwidth and low precision. In one embodiment of the present disclosure, the linear amplifier and the basic voltage output unit are connected in series for output, the basic voltage output unit outputs a high-efficiency, low-bandwidth and low-precision basic signal, and the linear amplifier outputs a low-efficiency, high-bandwidth and high-precision compensation signal, so that a high-bandwidth and high-precision signal is output after the series connection, and the efficiency is higher than the efficiency when only the linear amplifier is used.

Meanwhile, in this embodiment of the present disclosure, the linear amplifier is further connected in parallel with the switch tracking current source which is also a high-efficiency, low-bandwidth and low-precision output unit for outputting a low-frequency part of the load current (occupying a large part of the final output current), so that the output current of the linear amplifier may be reduced, the output power of the linear amplifier may be lowered, and the power loss caused by the low output power of the linear amplifier is reduced, thus further improving the efficiency of the whole fast tracking power supply device.

Embodiment 2

Figure 3:
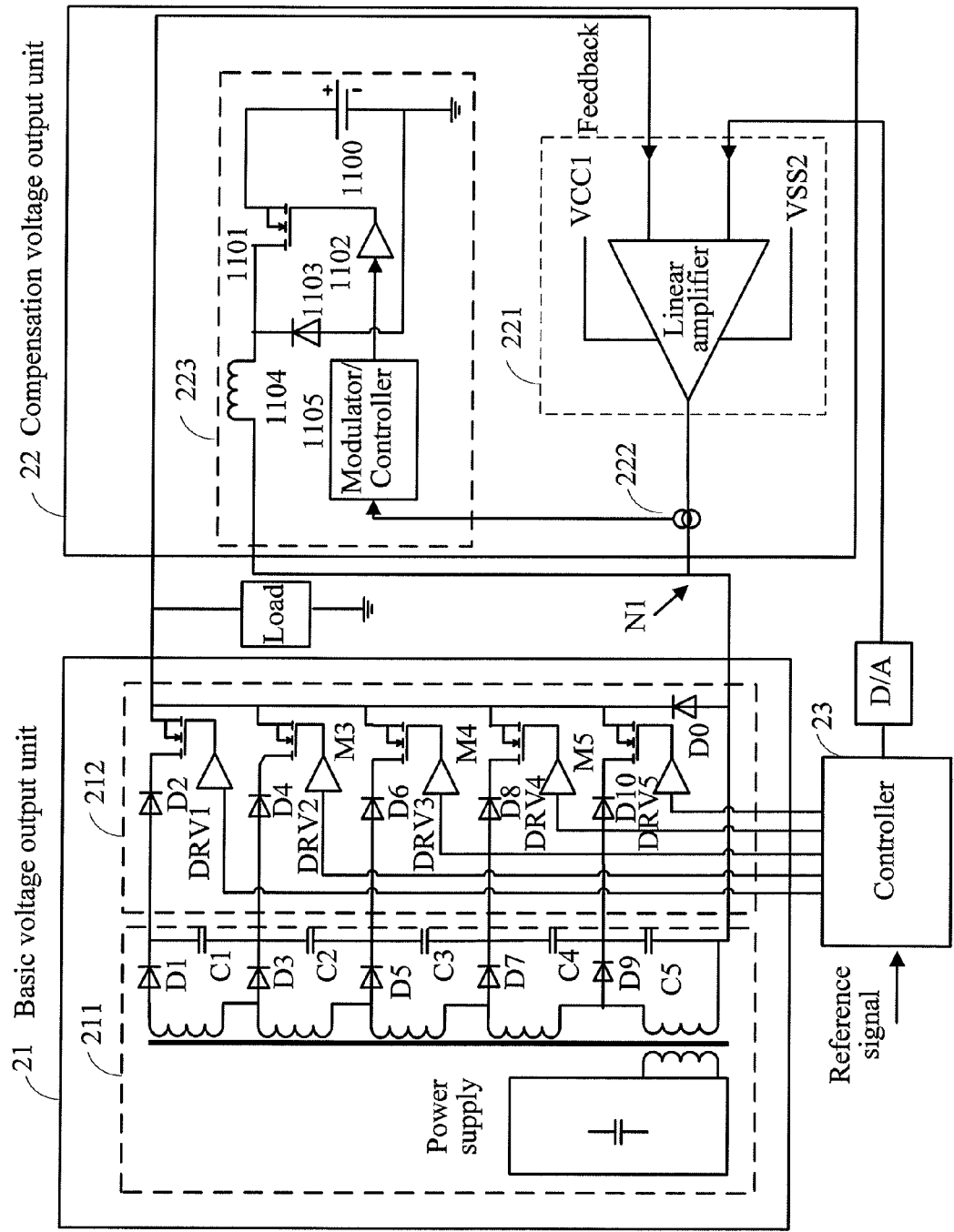
FIG. 3 is a circuit diagram of a specific implementation of a tracking power supply according to Embodiment 2 of the present disclosure.

A specific circuit diagram of a tracking power supply according to an embodiment of the present disclosure is provided. Referring to FIG. 3, the tracking power supply includes: a basic voltage output unit 21, configured to provide a basic voltage; and a compensation voltage output unit 22, configured to provide a compensation voltage.

The compensation voltage output unit 22 uses a ground level as the reference level, and outputs a level which is used as the reference level of the basic voltage output unit 21. The compensation voltage output unit 22 is connected in series with the basic voltage output unit 21 and then connected with a load.

The tracking power supply according to the embodiment of the present disclosure may be configured to output the input reference signal after amplification. A voltage of the output signal has two parts. One part is provided by the basic voltage output unit 21 and the part is provided by the compensation voltage output unit 22. Herein, the waveform of the basic voltage is substantially similar to that of the required target output voltage, but the precision is low. In order to obtain a high-precision output voltage, a compensation voltage needs to be output through a compensation voltage output unit to perform compensation. The tracking power supply according to the embodiment of the present disclosure may be applied in the occasion that a tracking voltage needs to be provided.

Figure 4:
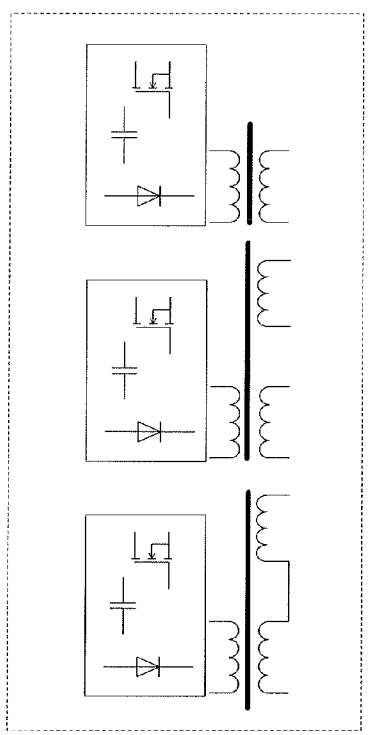
FIG. 4 is a schematic view of the tracking power supply using a plurality of isolation power supplies according to Embodiment 2 of the present disclosure.

Specifically, the basic voltage output unit 21 includes a level providing unit 211 and a level shift unit 212. The level providing unit includes one or more isolation power supplies, and performs output through transformer coupling. FIG. 3 is a schematic view of multi-path (herein, five-path) output by one isolation power supply through transformer coupling. In the actual application, a plurality of isolation power supplies may be used, and single-path or multi-path output is performed for each isolation power supply. FIG. 4 is a schematic view of output by three isolation power supplies. Referring to FIG. 4, the topmost isolation power supply (401) performs single-path output, and the other two isolation power supplies (402, 403) both perform two-path output.

The level shift unit 212 includes multiple selection branches constituted by diodes (such as D2 and D4), MOSFETs (such as M1 and M2), and driving components (such as DRV1 and DRV2), and each tributary is connected with one output of the level providing unit. For example, the level providing unit in one embodiment of the present disclosure has five outputs, and then five selection units are set herein to respectively connect with the five outputs. The diode is configured to prevent forward current of different voltage level sources and provide a reverse prohibition function. The MOSFET is equivalent to a switch tube and is configured to select whether to output the power signal connected with the MOSFET through a control signal, and when multiple power signals exist, the MOSFET performs multi-path selection according to the control signal. In the actual application, it is necessary to select a MOSFET with a switching speed that can meet the performance according to the bandwidth of a signal. The driving component is configured to provide a drive for the MOSFET, and may specifically employ a bootstrap driving component or an isolation driving component.

Figure 5:
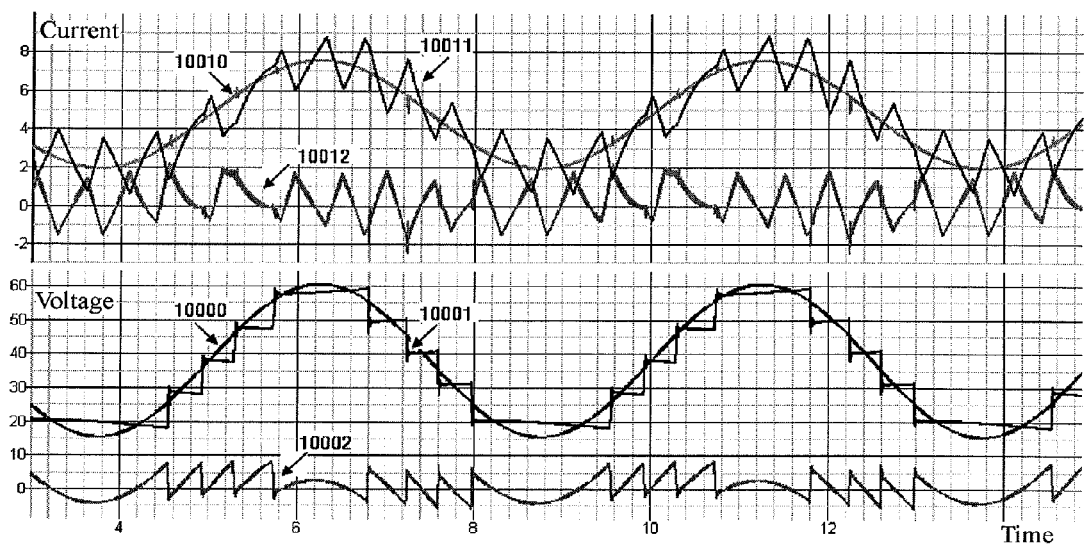
FIG. 5 is a schematic view of voltage output waveforms and current output waveforms of units in the fast tracking power supply according to Embodiment 2 of the present disclosure.

When a certain level needs to be output, the control signal controls turn-on of the MOSFET through the driving component, and an output signal corresponding to the isolation power supply is output. FIG. 5 is a schematic view of waveforms of output signals of voltages according to an embodiment of the present disclosure. Referring to FIG. 5, the curve 10000 is a final required output voltage, and the curve 10001 is a voltage output by the basic voltage output unit. It can be seen that, after a corresponding level is selected to output through the level shift circuit, the basic voltage finally output by the basic voltage output unit is a stepwise waveform curve.

It should be noted that the aforementioned constitution of the level shift unit is not the only one. In the actual application, the level shift unit may also be constituted by other similar functional circuits or integrated components with corresponding functions. For example, the MOSFET may also be replaced by a triode, which is not limited herein.

The basic voltage output unit 21 may output a low-precision signal by selecting the level, and at this time, the compensation voltage output unit is required to compensate the output signal of the basic voltage output unit.

Specifically, the compensation voltage output unit 22 includes a switch tracking current source 223 and a linear amplifier 221, in which the switch tracking current source 223 and the linear amplifier 221 are connected in parallel (the node N1 in FIG. 3 is a parallel connection node) and then connected in series with the basic voltage output unit.

The parallel connection of the linear amplifier 221 and the switch tracking current source 223 is configured to compensate the basic voltage output by the basic voltage output unit. The switch tracking current source 223 is configured to output a low-frequency part of a load current. The linear amplifier 221 also outputs a compensation current to compensate the low-frequency part of the load current output by the switch tracking current source, so that the output current after parallel connection of the linear amplifier and the switch tracking current source is equal to the load current.

In an embodiment, the output of the linear amplifier 221 is connected with the output of the basic voltage output unit 21 after being connected in forward series with a diode D0, and the diode D0 is forward conducted to provide a "zero level" for the basic voltage output unit 21, that is, a load current path is provided when the required basic voltage approaches the zero level.

The linear amplifier may output a high-bandwidth and high-precision signal (but the efficiency is low), and an analog signal is input to the linear amplifier. If the received original control signal is a digital signal, D/A conversion is required to convert the digital signal into an analog signal. As shown in FIG. 3, the signal is output to the linear amplifier after D/A conversion.

Referring to FIG. 5, the waveform of the compensation voltage output by the linear amplifier is shown as the curve 10002. By compensating the basic voltage 10001, the waveform of the final output signal in the embodiment of the present disclosure is shown as the curve 10000.

The switch tracking current source includes a switch mode current supply circuit constituted by elements such as a switching component, a diode, a driving component, and an inductance. The output current of the switch tracking current source is controlled according to detecting result of the output current of the linear amplifier by the current detection unit, and when the output current of the linear amplifier increases, the output current of the switch tracking current source is increased, thus decreasing the output current of the linear amplifier. Moreover, because the switch tracking current source has a low tracking bandwidth (due to the limitation of the switching frequency), the low-frequency tracking of the output load current is implemented.

As shown in FIG. 5, the current output waveform of the switch tracking current source is shown as the curve 10011, the curve 10012 shows a compensation current output by the linear amplifier, and the waveform of the final output current is shown as the curve 10010.

In order to control the circuits of above units, one embodiment of the present disclosure further includes a control unit 23, which is configured to output control signals to the level selection circuit in the basic voltage output circuit and the linear amplifier respectively according to an input reference signal.

The reference signal herein is an envelope signal detected by an envelope detector. The envelope signal may be an analog signal or a digital signal after digitalization by the envelope detector, which is not limited herein. The control unit controls the basic voltage output unit to output a suitable voltage according to the reference signal, and controls the linear amplifier to output a compensation voltage.

For example, if the reference signal received by the control unit is 10 mV, and the final desired amplified output signal is 12 V, at this time, a MOSFET in the level selection circuit in the basic voltage output unit may be turned on to output a level (assumed as 10 V) corresponding to the selection unit. Besides, in order to obtain a required output signal, the linear amplifier needs to be controlled to compensate the basic voltage. The final voltage and current output waveforms of the units are shown in FIG. 5.

The current detection unit detects the output current of the linear amplifier, and provides a third control signal, so that the switch tracking current source provides a low-frequency part of a load current.

In the process of controlling other units, the control unit further needs to perform delay matching, so that a correct output signal is obtained by performing signal superposition on the levels and currents output by the modules at the same time so as to obtain a correct output signal.

Figure 6:
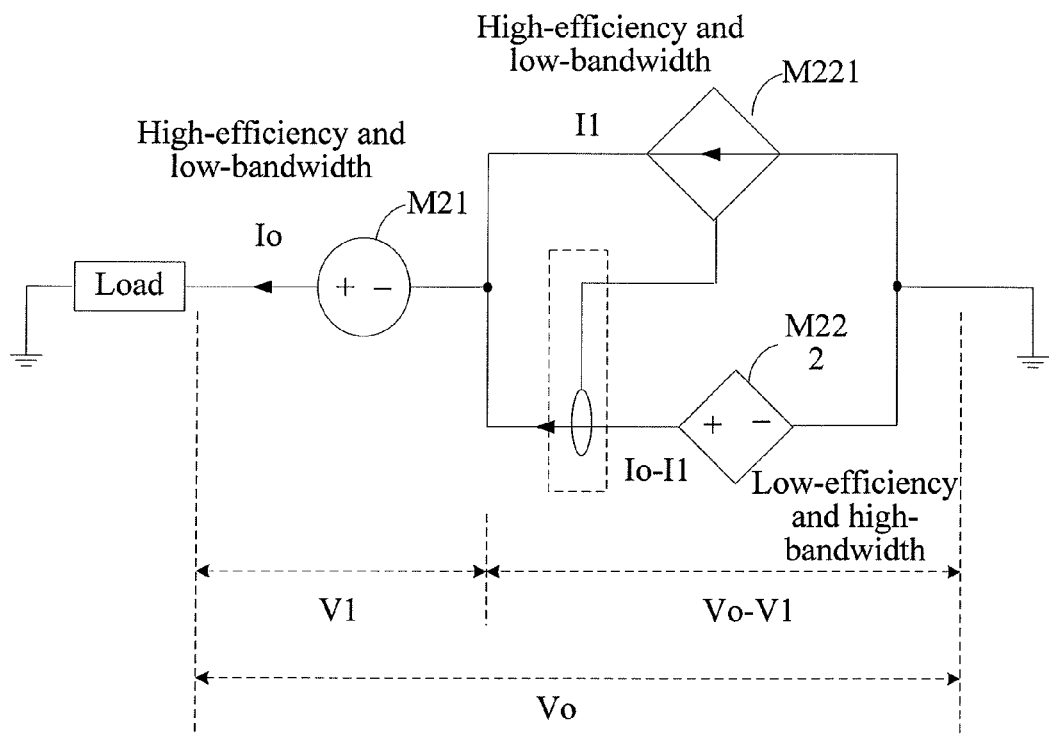
FIG. 6 is a schematic equivalent circuit diagram of the tracking power supply according to Embodiment 2 of the present disclosure.

Referring to FIG. 6, it is a schematic equivalent circuit diagram corresponding to FIG. 3.

M21 includes a plurality of voltage supplies and a shift switch, and is equivalent to the basic voltage output unit 21 in FIG. 3. M22 includes M221 and M222, and is equivalent to the compensation voltage output unit 22 in FIG. 3.

Specifically, M22 includes M221, M222, and M223, in which M221 is equivalent to the linear amplifier 221 in FIG. 2B, M222 is equivalent to the current detection unit 222 in FIG. 3, and M223 is equivalent to the switch tracking current source 223 in FIG. 3.

In the circuit shown in FIG. 6, the linear amplifier M221 may output a high-bandwidth and high-precision signal (determined by characteristics of the component), but the output efficiency is low; by contrast, the basic voltage output unit M21 constituted by the shift circuit and the switch tracking current source M223 may output a high-efficiency signal, but the bandwidth and precision are low. In the embodiment of the present disclosure, the linear amplifier M221 and the basic voltage output unit M21 are connected in series for output, which not only meets the requirement for high bandwidth and high precision, but also enables the system efficiency not to be too low.

At the same time, in one embodiment of the present disclosure, the linear amplifier M221 is further connected in parallel with the switch tracking current source M223, and the function of the switch tracking current source M223 is to improve the efficiency of the whole device. Although the linear amplifier M221 may output a high-bandwidth and high-precision signal, the efficiency is low. The basic voltage output unit M21 and the switch tracking current source M223 are opposite. The bandwidth and precision of the signal output by them is lower than those of the linear amplifier, but the output efficiency is much higher than the efficiency of the linear amplifier M221. By providing a low-frequency part of a load current (that is, a large part of the current) by the switch tracking current source M223, the linear amplifier M221 may provide only a small part of the current, so that the influence of the linear amplifier M221 on the overall efficiency of the device is reduced, thus improving the efficiency of the whole device.

The function of the parallel connection with the basic current output unit M211 may be specifically explained with reference to FIGS. 6, 7A, and 7B (M21, M221, M222 are simplified to be represented by a voltage supply or a current supply). Because the load parameters may be determined when the system is designed, the parameters of the final output voltage and current are also determined in the embodiment of the present disclosure. It is assumed that the final output voltage is Vo and the final output current is Io, and the efficiency of the basic voltage output unit M21 is $\eta_{m1}$, the efficiency of the switch tracking current source M223 is $\eta_{m2}$, and the efficiency of the linear amplifier M221 is $\eta_n$, in which $\eta_{m1}$ and $\eta_{m2}$ are relatively large (over 90%), while $\eta_n$ is relatively small (generally below 40%).

FIG. 6 is a schematic equivalent circuit diagram with parallel connection of the current supply and the linear amplifier. Referring to FIG. 6, supposing that the output voltage of the basic voltage output unit M21 is V1, and the output current of the switch tracking current source M223 is I1, the output voltage of the linear amplifier M221 is Vo−V1, and the output current of the linear amplifier is Io−I1. In order to output a final voltage V0 and a final current Io, the required power provided by the whole device is as follows:

$$Pin\_1 = V1*Io/\eta_{m1} + (Vo-V1)*(Io-I1)/\eta_n + (Vo-V1)*I1/\eta_{m2} \quad (S1).$$

Figure 7A:
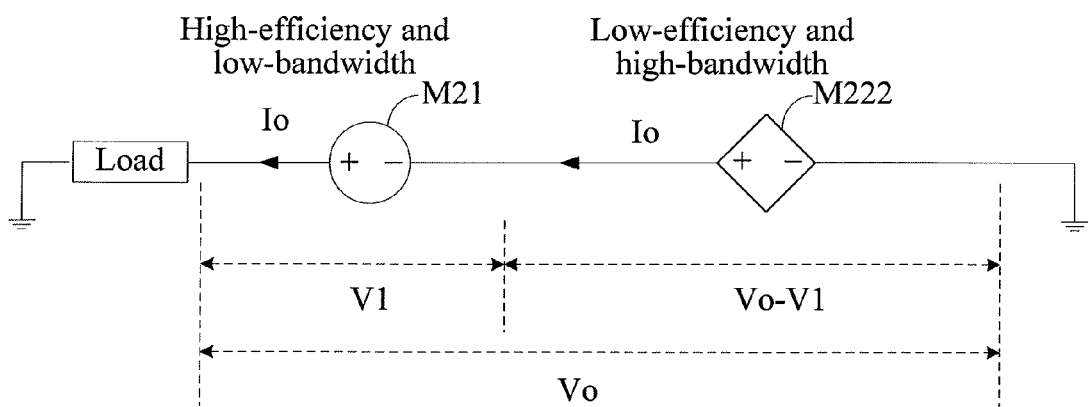
FIG. 7A is a schematic equivalent circuit diagram of the tracking power supply without a switch tracking current source and a current detection unit according to Embodiment 2 of the present disclosure.

FIG. 7A is a schematic equivalent circuit diagram without the parallel connection of the current supply and the linear amplifier. Referring to FIG. 7A, supposing that the output voltage of the basic voltage output unit M21 is V1, and the output voltage of the linear amplifier M221 is Vo−V1, in order to output a final voltage V0 and a final current Io, the required power provided by the whole device is as follows:

$$Pin\_2 = (V1*Io)/\eta_{m1} + (Vo-V1)*Io/\eta_n \quad (S2).$$

Formula S2 is transformed by adding and then subtracting (Vo−V1)*I1/$\eta_n$ and the following formula is obtained:

$$Pin\_2 = V1*Io/\eta_{m1} + (Vo-V1)*(Io-I1)/\eta_n + (Vo-V1)*I1/\eta_n \quad (S3).$$

It can be known by comparing Formula S1 with Formula S3 that, the first two items of the two polynomials are the same, while the last items are different. It can be known by observing the last items that, the numerators of the two are the same, while the denominator $\eta_{m2}$ is larger (such as 80%-90%), and $\eta_n$ is smaller (such as <40%). Therefore, the following formula is obtained:

$$(Vo-V1)*I1/\eta_{m2} < (Vo-V1)*I1/\eta_n.$$

Figure 7B:
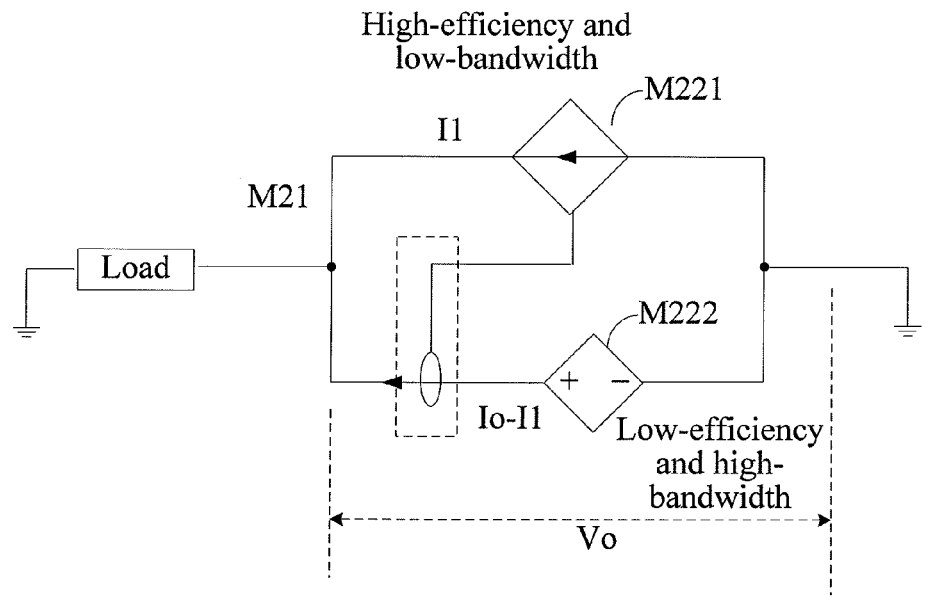
FIG. 7B is a schematic equivalent circuit diagram of the tracking power supply without a basic voltage output unit according to Embodiment 2 of the present disclosure.

FIG. 7B is a schematic equivalent circuit diagram with the parallel connection of the current supply and the linear amplifier without using the basic voltage output unit. Referring to FIG. 7B, in order to output a final voltage V0 and a final current Io, the output voltage of the switch tracking current source is Vo, the output current is I1; the output voltage of the linear amplifier M221 is Vo and the output current is Io−I1, the input power of the whole device is as follows:

$$Pin\_3 = Vo^*(Io-I1)/\eta_n + Vo^*I1/\eta_{m2} \quad (S4).$$

Formula S2 is transformed by adding and then subtracting $(Vo-V1)^*I1/\eta_n$, and the following formula is obtained:

$$Pin\_3 = V1^*Io/\eta_n + V1^*I1/\eta_{m2} + (Vo-V1)^*(Io-I1)/\eta_n + (Vo-V1)^*I1/\eta_{m2} \quad (S5).$$

It can be known by comparing Formula S1 with Formula S5 that, the last two items of the two polynomials are the same, while the first items are different. It can be known by observing the last items that, the numerators of the two are the same, while the denominator $\eta_{m1}$ is larger (such as 80%-90%), and $\eta_n$ is smaller (such as <40%). Therefore, the following formula is obtained:

$$V1^*Io/\eta_{m1} < V1^*Io/\eta_n + V1^*I1/\eta_{m2}.$$

It can be seen that the input power of the tracking power supply is Pin_1<Pin_2, Pin_1<Pin_3, that is, when the same power is output, the input power of the device of the present disclosure is smaller than that of the device without parallel connection of the current supply, and the input power of the device of the present disclosure is also smaller than that of the device without the basic voltage output unit. It can be seen that the present disclosure further improves the efficiency of the whole device.

To sum up, in the embodiment of the present disclosure, the basic voltage output unit, the switch tracking current source, and the linear amplifier employ the series-parallel connection structure for output, and a high-bandwidth, high-precision and high-efficiency signal is output by fully using their respective features (such as high bandwidth of the linear amplifier, and high efficiency of the basic voltage output unit and the switch tracking current source), thus better meeting the application requirements for the fast tracking power supply.

Embodiment 3

Figure 8:
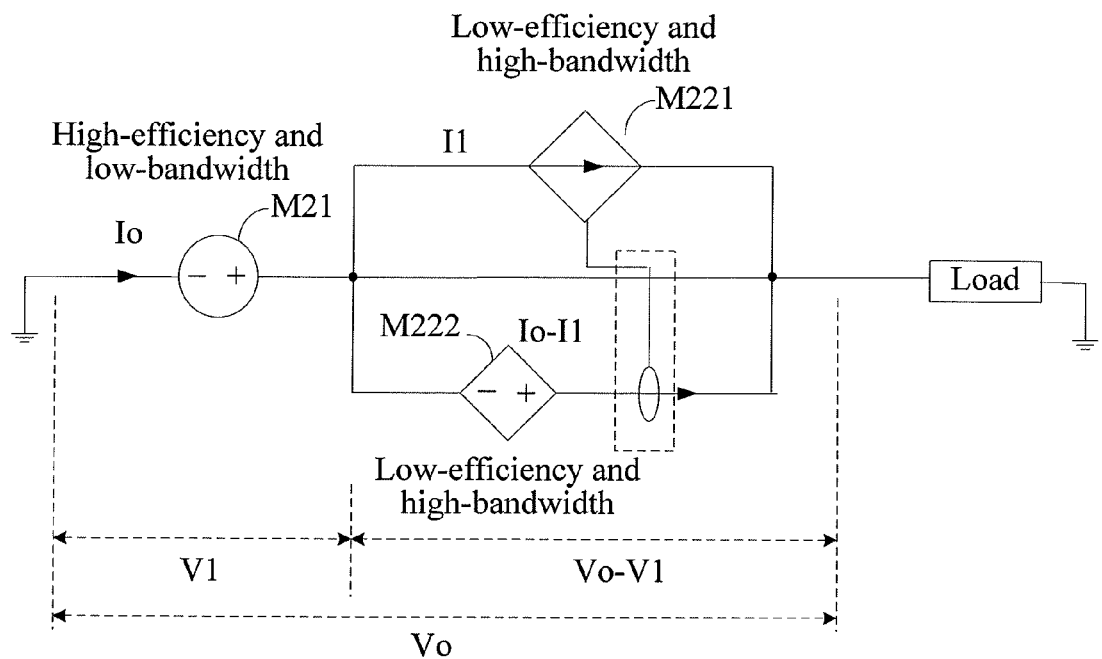
FIG. 8 is a schematic equivalent circuit diagram of a tracking power supply according to Embodiment 3 of the present disclosure.

FIG. 8 is a schematic diagram of a tracking power supply according to another embodiment of the present disclosure. Referring to FIG. 8, the tracking power supply includes a basic voltage output unit 21, configured to provide a basic voltage; and a compensation voltage output unit 22, configured to provide a compensation voltage. The basic voltage output unit 21 uses a ground level as the reference level, and outputs a level which is used as the reference level of the compensation voltage output unit 22. The basic voltage output unit 21 is connected in series with the compensation voltage output unit 22 and then connected with a load. The specific implementation of the basic voltage output unit 21 and the compensation voltage output unit 22 can be seen in the implementation in Embodiment 2, and is not described herein again.

Embodiment 4

Figure 9:
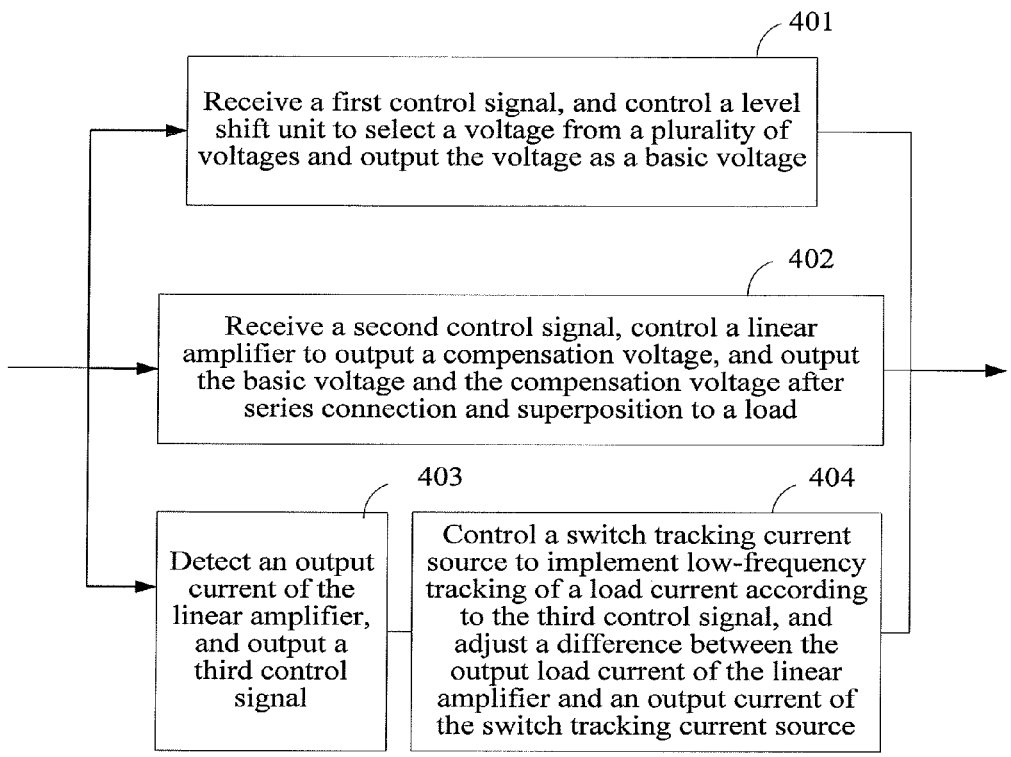
FIG. 9 is a flow chart of a method for controlling a tracking power supply according to Embodiment 4 of the present disclosure.

A method for controlling a tracking power supply is provided according to one embodiment of the present disclosure. The present disclosure is based on the tracking power supply device shown in FIG. 2A. The specific implementation of the device can be seen in the relevant embodiments in Embodiment 2 and Embodiment 3, and is not described herein again. Referring to FIG. 9, the method for controlling a fast tracking power supply device according to one embodiment of the present disclosure includes the following steps:

S401: receiving a first control signal, and controlling a level shift unit to select a voltage from a plurality of voltages and output the voltage as a basic voltage;

S402: receiving a second control signal, controlling a linear amplifier to output a compensation voltage, and outputting the basic voltage and the compensation voltage after series connection and superposition to a load;

S403: detecting an output current of the linear amplifier, and outputting a third control signal; and S404: controlling a switch tracking current source to implement low-frequency tracking of a load current according to the third control signal, and reducing an effective value of the output current of the linear amplifier, in which the output current of the linear amplifier is a difference between the load current and an output current of the switch tracking current source.

It should be noted that, the sequence of performing the aforementioned three steps is not required strictly, but in the final output, the units of the fast tracking power supply are required to output their respective signals at the same time. In the actual application, it is usually hard for a high-bandwidth signal to directly control the units to output signals at the same time through a reference signal. Therefore, delay matching is further required to enable the units to output signals synchronously.

Moreover, the method for controlling a tracking power supply further includes: performing delay matching on the first control signal and the second control signal.

Moreover, the method for controlling a tracking power supply further includes: receiving a reference signal, and outputting the first control signal and the second control signal according to the reference signal. The reference signal herein is an output signal of an envelope detector, and general has low voltage and power, which needs to be tracked and amplified through a fast tracking circuit.

The step of controlling the switch tracking current source to implement low-frequency tracking of the load current according to the third control signal includes:

when it is detected that the output current of the linear amplifier becomes larger, controlling, by the third control signal, the switch tracking current source to increase the output current accordingly; and when it is detected that the output current of the linear amplifier becomes negative, controlling, by the third control signal, the switch tracking current source to reduce the output current accordingly.

In one embodiment of the present disclosure, the linear amplifier may output a high-bandwidth and high-precision signal, but the efficiency is low; by contrast, the basic voltage output unit has high output efficiency, but the tracking bandwidth and precision are low. In one embodiment of the present disclosure, the linear amplifier and the basic voltage output unit are connected in series for output, the basic voltage output unit outputs a basic signal (with high efficiency, low bandwidth, and low precision), and the linear amplifier outputs a compensation signal (with low efficiency, high bandwidth, and high precision), so that a high-bandwidth and high-precision signal is output after the series connection, and the efficiency is higher than the efficiency when only the linear amplifier is used.

In one embodiment of the present disclosure, the linear amplifier is further connected in parallel with the switch tracking current source which is a switch mode tracking current supply also having output characteristics of high efficiency, low bandwidth, and low precision for outputting a low-frequency part of a load current (occupying a large part of the load current), so that the output current of the linear amplifier may be reduced, the output power of the linear amplifier may be lowered, and the power loss caused by the low output power of the linear amplifier is reduced, thus further improving the efficiency of the whole fast tracking power supply device.

Embodiment 5

Figure 10:
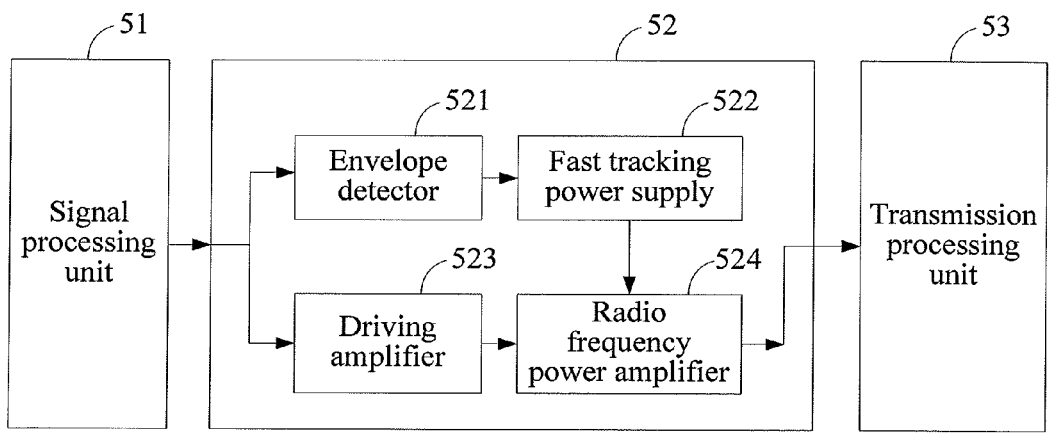
FIG. 10 is a schematic structural view of a communication apparatus according to Embodiment 5 of the present disclosure.

A communication apparatus is provided in an embodiment of the present disclosure, referring to FIG. 10, the communication apparatus includes: a signal processing unit 51, configured to provide a radio frequency signal;

a radio frequency amplification unit 52, configured to perform radio frequency amplification on the received radio frequency signal; and a transmission processing unit 53, configured to perform a transmission process on the radio frequency signal amplified by the radio frequency amplification unit.

The radio frequency amplification unit 52 includes:

an envelope detector 521, configured to detect an envelope of the received radio frequency signal and obtain an envelope signal;

a fast tracking power supply 522, configured to receive the envelope signal output by the envelope detector, and amplify the envelope signal, in which the fast tracking power supply employs the fast tracking power supply device in Embodiment 1, and the specific implementation and control method thereof can be seen in the relevant embodiments in Embodiment 2, Embodiment 3, and Embodiment 4, and is not described herein again;

a driving amplifier 523, configured to perform driving amplification on the received radio frequency signal; and a radio frequency power amplifier 524, configured to receive the envelope signal amplified by the fast tracking power supply and the amplified signal output by the driving amplifier, and amplify the radio frequency signal.

The driving amplifier in the embodiment of the present disclosure may be regarded as the first stage of amplification circuit in the whole radio frequency amplification unit 52, and the radio frequency power amplifier may be regarded as the second stage of amplification circuit.

The communication apparatus may be a base station or other communication apparatus in which a radio frequency amplifier needs to be used.

In one embodiment of the present disclosure, the linear amplifier in the fast tracking power supply may output a high-bandwidth signal, but the efficiency is low; by contrast, the basic voltage output unit has high output efficiency, but the bandwidth of the output signal is low. In one embodiment of the present disclosure, the linear amplifier and the basic voltage output unit are connected in series for output, the basic voltage output unit outputs a basic signal (with high efficiency, low bandwidth, and low precision), and the linear amplifier outputs a compensation signal (with low efficiency, high bandwidth, and high precision), so that a high-bandwidth signal is output after the series connection, and the efficiency is higher than the efficiency when only the linear amplifier is used.

In the embodiment of the present disclosure, the linear amplifier is further connected in parallel with a basic current output unit which is also a high efficiency, low bandwidth and low precision output unit for outputting a basic current (occupying a large part of the final output current), so that the output current of the linear amplifier may be reduced, the output power of the linear amplifier may be lowered, and the power loss caused by the low output power of the linear amplifier is reduced, thus further improving the efficiency of the whole fast tracking power supply device.

According to some embodiments of the present disclosure, a high-efficiency, low-bandwidth and low-precision signal is output through a basic voltage output unit, a low-efficiency, high-bandwidth and high-precision signal is output through a linear amplifier, and a high-bandwidth and high-precision signal is output after series connection and the efficiency is higher than the efficiency when only the linear amplifier is used. At the same time, the linear amplifier is connected in parallel with a high-efficiency, low-bandwidth and low-precision basic current output unit, and a low-frequency part (the tracking signal power is mainly concentrated in the low-frequency part) in an output current is provided through a switch tracking current source, so that the output current of the linear amplifier is reduced, the output power of the linear amplifier is lowered, and the power loss caused by the low output efficiency of the linear amplifier is reduced, thus further improving the efficiency of the whole fast tracking power supply device.

The objectives, technical solutions, and advantages of the present disclosure are descried further above in detail through the preferred embodiments. It should be noted that the above descriptions are merely preferred embodiments of the present disclosure, but are not intended to limit the present disclosure. Any modification, equivalent replacement, or improvement made without departing from the spirit and principle of the present disclosure should fall within the protection scope of the present disclosure.

What is claimed is:

1. A tracking power supply, comprising:
   a basic voltage output unit comprising a level providing unit and a level shift unit, the level providing unit configured to provide one or more level outputs, the level shift unit configured to select the level outputs in the level providing unit according to a received first control signal, and output the selected level output as a basic voltage;
   a linear amplifier, configured to output a compensation voltage according to a second control signal, wherein the compensation voltage is configured to compensate the basic voltage;
   a current detection unit, configured to detect an output current of the linear amplifier, and output a third control signal; and
   a switch tracking current source, configured to receive the third control signal, adjust an output current, implement low-frequency tracking of a load current, and reduce an effective value of the output current of the linear amplifier,
   wherein the linear amplifier and the switch tracking current source are connected in parallel and then connected in series with the level shift unit.

2. The power supply according to claim 1, further comprising one of the following:
   a control unit, configured to receive a reference signal, output the first control signal to the basic voltage output unit, and output the second control signal to the linear amplifier;
   and
   a control unit, configured to output the first control signal to the basic voltage output unit according to a reference signal.

3. The power supply according to claim 2, wherein the control unit is further configured to:
perform delay matching on the first control signal and the second control signal.

4. The power supply according to claim 1, wherein
the level providing unit comprises one or more power supplies, and each of the power supplies outputs one or more levels; and
the level shift unit comprises one or more level selection branches, each of the level selection branches corresponds to the level output by the isolation power supply, and the level selection branch comprises a switching component configured to select the one or more levels output by the isolation power supply, and output the selected level output as the basic voltage.

5. The power supply according to claim 1, wherein
when the current detection unit detects that the output current of the linear amplifier becomes larger, the third control signal controls the switch tracking current source to increase the output current thereof accordingly; and
when the current detection unit detects that the output current of the linear amplifier becomes negative, the third control signal controls the switch tracking current source to reduce the output current thereof accordingly.

6. The power supply according to claim 1, wherein the switch tracking current source is a current-controlled current supply, and uses a topology of a switch in one of the following: a BUCK, a BOOST, a BUCK-BOOST, and a CUK topology.

7. The power supply according to claim 1, wherein
a reference level of the linear amplifier and the switch tracking current source is a ground level, and a reference level of the level shift unit is an output level of the linear amplifier.

8. The power supply according to claim 1, wherein
a reference level of the level providing unit and the level shift unit is a ground level, and a reference level of the linear amplifier is an output level of the level shift unit.

9. A method for controlling a tracking power supply, comprising:
receiving a first control signal, and controlling a level shift unit to select a voltage from a plurality of voltages and output the selected voltage as a basic voltage;
receiving a second control signal, controlling a linear amplifier to output a compensation voltage, and outputting the basic voltage and the compensation voltage after series connection and superposition to a load; and
detecting an output current of the linear amplifier, outputting a third control signal, controlling a switch tracking current source to implement low-frequency tracking of a load current according to the third control signal, and reducing an effective value of the output current of the linear amplifier.

10. The method according to claim 9, further comprising:
performing delay matching on the first control signal and the second control signal.

11. The method according to claim 9, further comprising:
receiving a reference signal and outputting the first control signal and the second control signal according to the reference signal.

12. The method according to claim 9, wherein controlling the switch tracking current source to implement low-frequency tracking of the load current according to the third control signal comprises:
when a current detection unit detects that the output current of the linear amplifier becomes larger, controlling, by the third control signal, the switch tracking current source to increase an output current thereof accordingly; and
when the current detection unit detects that the output current of the linear amplifier becomes negative, controlling, by the third control signal, the switch tracking current source to reduce the output current thereof accordingly.

13. A communication apparatus, comprising:
a radio frequency amplification unit, configured to perform radio frequency amplification on a received radio frequency signal; and
a transmission processing unit, configured to perform a transmission process on the radio frequency signal amplified by the radio frequency amplification unit,
wherein the radio frequency amplification unit comprises:
an envelope detector, configured to detect an envelope of the received radio frequency signal and obtain an envelope signal;
a tracking power supply, configured to receive the envelope signal and amplify the envelope signal;
a driving amplifier, configured to amplify the received radio frequency signal;
a radio frequency power amplifier, configured to receive the amplified envelope signal from the tracking power supply and the amplified radio frequency signal output from the driving amplifier, and amplify the amplified radio frequency signal; wherein the tracking power supply comprises:
a basic voltage output unit comprising a level providing unit and a level shift unit, the level providing unit configured to provide one or more level outputs, the level shift unit configured to select the level outputs in the level providing unit according to a received first control signal, and output a basic voltage;
a linear amplifier, configured to output a compensation voltage according to a second control signal, wherein the compensation voltage is configured to compensate the basic voltage;
a current detection unit, configured to detect an output current of the linear amplifier, and output a third control signal; and
a switch tracking current source, configured to receive the third control signal, adjust an output current, provide a low-frequency high current in a load current, and reduce an effective value of the output current of the linear amplifier,
wherein the linear amplifier and the switch tracking current source are connected in parallel and then connected in series with the level shift unit.

14. The communication apparatus according to claim 13, wherein the tracking power supply further comprises:
a control unit, configured to receive the envelope signal, output the first control signal to the basic voltage output unit, and output the second control signal to the linear amplifier.

15. The communication apparatus according to claim 13, wherein
the level providing unit comprises one or more power supplies, and each of the power supplies outputs one or more levels; and
the level shift unit comprises one or more level selection branches, each of the level selection branches corresponds to the level output by the isolation power supply, and the level selection branch comprises a switching component configured to select on the one or more levels output by the isolation power supply, and output the selected level output as the basic voltage.

16. The communication apparatus according to claim 13, wherein when the current detection unit detects that the output current of the linear amplifier increases, the third control signal controls the switch tracking current source to increase the output current accordingly; and when the current detection unit detects that the output current of the linear amplifier becomes negative, the third control signal controls the switch tracking current source to reduce the output current accordingly.

17. The communication apparatus according to claim 13, wherein the switch tracking current source is a current-controlled current supply, and uses a topology of a switch in one of the following: a BUCK, a BOOST, a BUCK-BOOST, and a CUK topology.

18. The communication apparatus according to claim 13, wherein a reference level of the linear amplifier and the switch tracking current source is a ground level and a reference level of the level shift unit is an output level of the linear amplifier.

19. The communication apparatus of claim 13 is a base station.

20. The communication apparatus according to claim 13, wherein a reference level of the level providing unit and the level shift unit is a ground level and a reference level of the linear amplifier is an output level of the level shift unit.

* * * * *